US008432036B2

(12) United States Patent
Hanson et al.

(10) Patent No.: US 8,432,036 B2
(45) Date of Patent: Apr. 30, 2013

(54) LEAD FRAMES WITH IMPROVED ADHESION TO PLASTIC ENCAPSULANT

(75) Inventors: Eric L. Hanson, Carlsbad, CA (US); Eric L. Bruner, San Diego, CA (US); Jeffrey Gotro, Trabuco Canyon, CA (US)

(73) Assignee: Aculon, Inc., San Diego, CA (US)

( * ) Notice: Subject to any disclaimer, the term of this patent is extended or adjusted under 35 U.S.C. 154(b) by 463 days.

(21) Appl. No.: 12/657,214

(22) Filed: Jan. 15, 2010

(65) Prior Publication Data

US 2010/0181659 A1    Jul. 22, 2010

Related U.S. Application Data

(60) Provisional application No. 61/205,699, filed on Jan. 22, 2009, provisional application No. 61/175,448, filed on May 4, 2009.

(51) Int. Cl.
*H01L 23/495* (2006.01)
*H01L 23/48* (2006.01)
*H01L 23/52* (2006.01)
*H01L 29/40* (2006.01)

(52) U.S. Cl.
USPC .......... 257/753; 267/666; 267/690; 267/734; 267/E23.018; 267/E21.514

(58) Field of Classification Search ............ 257/753, 257/E23.127, E23.16, 666, 690, 734, E23.018, 257/E21.514
See application file for complete search history.

(56) References Cited

U.S. PATENT DOCUMENTS

| 3,486,084 A | * | 12/1969 | Zido ............................ 257/788 |
| 3,911,475 A | | 10/1975 | Szedon et al. ................... 357/72 |
| 4,065,625 A | | 12/1977 | Iwai et al. ..................... 428/596 |
| 4,258,001 A | * | 3/1981 | Pierce et al. .................. 422/400 |
| 4,707,724 A | | 11/1987 | Suzuki et al. ................... 357/71 |
| 4,946,518 A | | 8/1990 | Spanjer et al. ................ 148/282 |
| 5,122,858 A | | 6/1992 | Mahulikar et al. .............. 357/70 |
| 5,153,385 A | | 10/1992 | Juskey et al. .................. 174/260 |
| 5,360,991 A | | 11/1994 | Abys et al. ..................... 257/666 |
| 6,369,452 B1 | | 4/2002 | Buchwalter et al. .......... 257/783 |
| 6,436,475 B1 | * | 8/2002 | Adler et al. .................... 427/358 |
| 6,518,647 B1 | | 2/2003 | Tellkamp ....................... 257/646 |
| 7,270,867 B1 | | 9/2007 | Kwan et al. .................... 428/111 |
| 7,329,617 B2 | | 2/2008 | Li et al. .......................... 438/780 |
| 7,491,286 B2 | * | 2/2009 | Kagan et al. ................... 156/230 |
| 7,734,426 B2 | * | 6/2010 | Hickman ........................ 702/19 |
| 7,815,963 B2 | * | 10/2010 | Schwartz et al. ............. 427/2.26 |
| 7,931,943 B2 | * | 4/2011 | Schwartz et al. ............. 427/402 |
| 2007/0212478 A1 | | 9/2007 | Fukunaga et al. ........... 427/96.2 |
| 2008/0014437 A1 | | 1/2008 | Dangelmaier |
| 2008/0032109 A1 | * | 2/2008 | Leising et al. ................ 428/220 |
| 2008/0131701 A1 | | 6/2008 | Hanson ......................... 428/412 |
| 2008/0206443 A1 | * | 8/2008 | Schwartz et al. ............. 427/2.26 |
| 2008/0244908 A1 | | 10/2008 | Petcavich et al. ................ 30/32 |

FOREIGN PATENT DOCUMENTS

| DE | 10 2004 047 510 A1 | 4/2006 |
| DE | 10 2006 032 074 B3 | 12/2007 |
| WO | WO 2007/070011 A1 | 6/2007 |

* cited by examiner

*Primary Examiner* — Teresa M Arroyo
(74) *Attorney, Agent, or Firm* — William J. Uhl

(57) ABSTRACT

A lead frame and an electronic package having improved adhesion between the lead frame and an encapsulating plastic material is disclosed. The lead frame can be pre plated having an outer layer comprising a precious metal such as palladium or gold to which is adhered a self-assembled monolayer (SAM), such as a SAM derived from an organophosphorus acid. The organophosphorus acid preferably is a mixture in which the organo groups are fluoro substituted hydrocarbons and hydrocarbons containing ethylenically unsaturated groups.

15 Claims, 3 Drawing Sheets

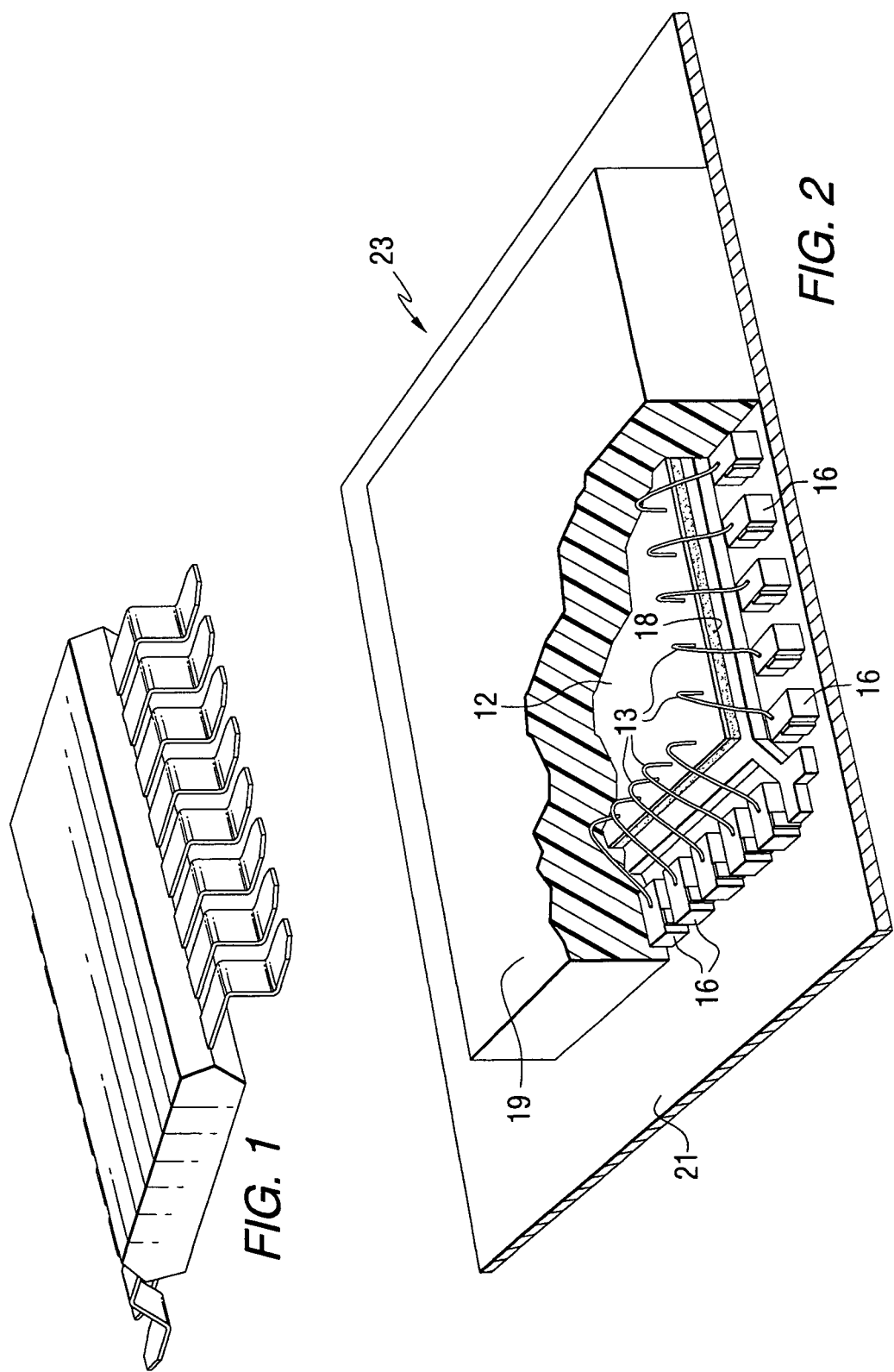

LEAD FRAMES WITH IMPROVED ADHESION TO PLASTIC ENCAPSULANT

CROSS REFERENCE TO RELATED APPLICATIONS

The present application claims priority from U.S. Provisional Patent Applications Ser. No. 61/205,699, filed Jan. 22, 2009, and Ser. No. 61/175,448, filed May 4, 2009.

FIELD OF THE INVENTION

The present invention relates to lead frames used in the assembly of semiconductor devices, and more particularly, to lead frames with improved adhesion to materials used in semiconductor die packaging, especially to composite materials used to encapsulate the lead frame. Another facet of the invention is the formation of a self-assembled monolayer (SAM) derived from an organophosphorus acid on a gold or palladium substrate.

BACKGROUND OF THE INVENTION

A lead frame is used as the electrical connection between a semiconductor chip and the printed circuit board (and thus to other electrical components). Lead frames are typically constructed of a base metal (e.g. copper) onto which subsequent metal layers may be deposited to enhance properties such as solderability. It is increasingly popular to plate layers of nickel, palladium and gold in order to get good adhesion of lead free solder to the lead frame surface. Lead frames are usually manufactured from a continuous strip of copper or copper metal alloy (optionally plated with additional layers) onto which a pattern is repeatedly stamped or etched comprising a central die pad that multiple inner leads extend out from to outer leads, which form the connection of the package to the board. Then, an adhesive is dispensed onto the die pad and a semiconductor chip called a die is placed on top and the adhesive is cured. Electrical connections are then made between the top of the semiconductor die and the leads via ultrasonically welded thin gold wires. This assembly is quite fragile, so it is protected by encapsulating it in an epoxy molding compound that provides mechanical durability to the assembly. After curing, the assembly is sectioned from the adjacent packages and it is connected to a printed circuit board (PCB) via soldering the leadfingers extending from the assembly to pads on the PCB. A typical semiconductor device is shown in FIG. 1.

An example of another semiconductor device is a "QFN" (Quad Flat Pack No Lead). Such a configuration is shown in FIG. 2 in which the leads are located on the bottom of the semiconductor device and are exposed as shown in FIG. 2 for soldering to the circuit board.

The lead frame is made from a conductive metal typically copper, a copper alloy, iron, or an iron alloy. Copper is preferred because of its corrosion resistance, electrical conductivity and solderability. The lead frame can also be pre plated, so named because the lead frames are plated prior to semiconductor device assembly. For example, a pre plated lead frame typically comprises a copper base that is electroplated (partially or fully) with a layer of nickel and then a thin layer of palladium followed by a flash layer of gold. FIG. 7 shows a schematic cross-section of a pre plated lead frame. The pre plated lead frames are desirable because they allow the use of environmentally friendly lead-free solders to attach the leads to the circuit board. Also, copper leads such as shown in FIG. 1 must be presoldered with lead-tin solders before attachment to the circuit board. This often results in "tin whiskers" contacting adjacent leads resulting in short circuiting of the semiconductor device. Pre plated leads such as those described above do not require presoldering and avoid the tin whisker problem.

After plating, an electrically and thermally conductive adhesive (called a 'die attach adhesive') is dispensed onto the central die pad then a die is placed on top of the adhesive layer. This assembly is then cured to fix the die to the die pad, providing a conductive path between the two. During this process, a common problem that occurs is called 'epoxy bleed out' where some of the organic vehicle (epoxy and reactive diluents, for example) bleed out of the adhesive and spread across the lead frame surfaces. This bled out layer of organics can have drastically negative effects on other processes and materials, such as wire bondability, solderability and mold compound adhesion. Reduction in these properties typically results in a poorer package that is more susceptible to environmental stresses and is overall less reliable. Due to this problem of epoxy bleed there is a pressing need in the industry to develop materials or methods to limit or stop this phenomenon. After the die attach step, the semiconductor die is then connected to the leadfingers by ultrasonically welding gold wires from pads on the die top to the leadfingers. This is then followed by encapsulation of the entire assembly in an epoxy molding compound.

Subsequent to encapsulation, the outer leads of the lead frame are soldered to a circuit board. During soldering, the temperatures of the encapsulated package may rise from about 200° C. to about 260° C. Particularly susceptible to this temperature increase are the QFN semiconductor devices. The rapid increase in temperature and subsequent cooling stresses the adhesive bond between the lead frame and the encapsulating plastic often resulting in failure along the plastic/metal interface. This may lead to moisture entering the assembly and subsequent failure of the semiconductive device.

To minimize separation between the encapsulating plastic and the metallic lead frame, several means to improve the adhesion have been proposed. These solutions include both means to increase mechanical adhesion and chemical adhesion. To improve mechanical adhesion, various configurations of holes, grooves and hemispheres have been formed in both the leads and the die pad. The holes and deformations increase the surface area of the lead frame component and also provide crevices for enhanced mechanical locking. For example, U.S. Pat. No. 4,862,246 to Masuda et al. discloses forming a series of hemispherical depressions on the die pad. These depressions increase the adhesion of the die pad to the molding resin increasing resistance to humidity.

A layer of nickel applied to a copper alloy lead frame has been found to increase the strength of the metal/plastic bond as disclosed in U.S. Pat. No. 4,888,449 to Crane et al. U.S. Pat. No. 4,707,724 to Suzuki et al. discloses coating the die pad with an alloy of tin/nickel or iron/nickel to increase adhesive strength.

Certain chemical solutions also increase the adhesive strength of the bond between copper and a plastic. U.S. Pat. No. 4,428,987 to Bell et al. discloses pretreating the copper surface to improve adhesion. The surface is electrolytically reduced and then coated with a solution such as benzotriazole. U.S. Pat. No. 5,122,858 discloses coating the lead frame with a polymer coating such as a polyolefin or a polyimide. U.S. Pat. No. 7,329,617 also discloses coating the lead frame with a coating based on a nitrogen-containing polymer such as a melamine-functional phenolic resin.

While the prior art processes are somewhat effective to increase the adhesion between the molding resin and the metal lead frame, the bond is still often inadequate and failures frequently occur.

SUMMARY OF THE INVENTION

The present invention provides for a lead frame for an electronic package comprising a self-assembled monolayer adhered directly or indirectly to at least a portion of the lead frame surface. Typically, the lead frame comprises a conductor surrounding a central aperture. The lead frame has a plurality of leads extending into the central aperture and a die pad located within the aperture having a top and bottom major surface. The top major surface of the die pad is adapted to receive a semi-conductor chip (die). In accordance with the invention, the lead frame is further characterized as having a SAM adhered directly or indirectly to at least a portion of the lead frame surface(s) such as to the bottom major surface or to both the top and bottom major surfaces of the die pad. The SAM is preferably derived from an organophosphorus acid. In a particularly preferred embodiment, the organo group comprises at least in parts fluoro and ethylenically unsaturated substituents.

In a particular embodiment, the lead frame comprises a copper or copper alloy base with an intermediate layer of nickel to which is adhered a subsequent layer of a precious metal such as palladium or gold.

In another embodiment of the invention, a substrate such as a lead frame comprises a layer of gold or platinum having adhered thereto either directly or indirectly a SAM of an organophosphorus acid.

BRIEF DESCRIPTION OF THE DRAWINGS

FIG. 1 is a perspective view of a semiconductor device.

FIG. 2 is a cutaway perspective drawing of a Quad Flat Pack No Lead ("QFN") semiconductor device.

DETAILED DESCRIPTION

Figure 3:
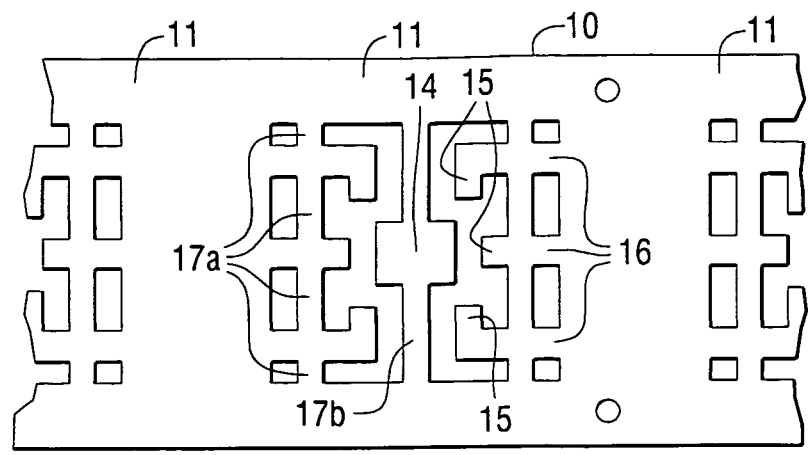
FIG. 3 is a plan view of a conductive strip containing a plurality of lead frames.
Figure 4:
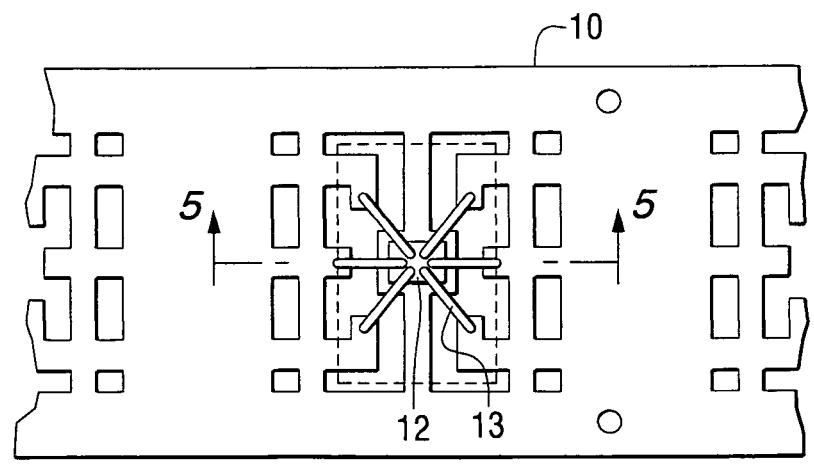
FIG. 4 is a plan view of a semi-conductor chip mounted on one of the lead frames with the electrodes of the chip connected to the inner lead portions of the lead frame by conducting wires.
Figure 7:
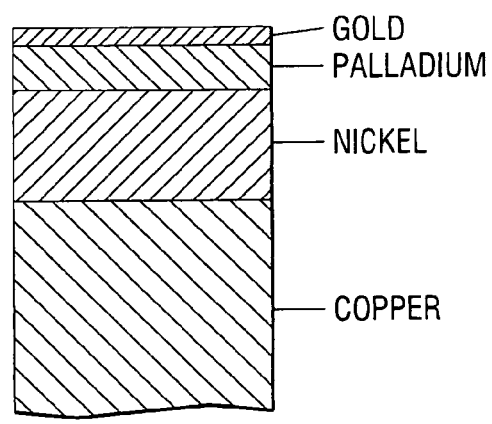
FIG. 7 is a schematic cross-sectional view of a pre plated lead frame.

Referring to FIGS. 3 and 4, reference numeral 10 denotes a conductive metal such as an iron, iron alloy, copper or copper alloy core strip having a thickness of, for example, 0.25 mm, both sides of which are optionally pre plated with an intermediate layer such as a layer of nickel to which is adhered a layer of a precious metal such as silver, gold or palladium. In a particular embodiment, a copper core can be pre plated with an intermediate nickel layer to which is adhered an intermediate palladium layer and to which is adhered a surface layer of gold. See FIG. 7. Typically the nickel layer has a thickness of 0.1 to 5 microns, the palladium layer has a thickness of 0.01 to 5 microns, and the gold layer has a thickness of up to 200 Angstroms such as 2 to 200 Angstroms. The strip 10 is punched in several places to provide a plurality of lead frames 11. The lead frames 11 comprise a chip-mounting portion (die pad) 14 on which there is mounted, for example, a semiconductor chip 12 bearing an integrated circuit (die); inner lead portions 15 for connecting the one side ends of metal wires 13 (FIG. 4), the other side ends of which are connected to the electrodes of the semiconductor chip 12; outer lead portions 16 formed by the extensions of the inner lead portions 15; and supporting portions or connecting portions 17a and 17b for mechanically stabilizing the die pad 14 and inner lead portions 15.

Figure 5:
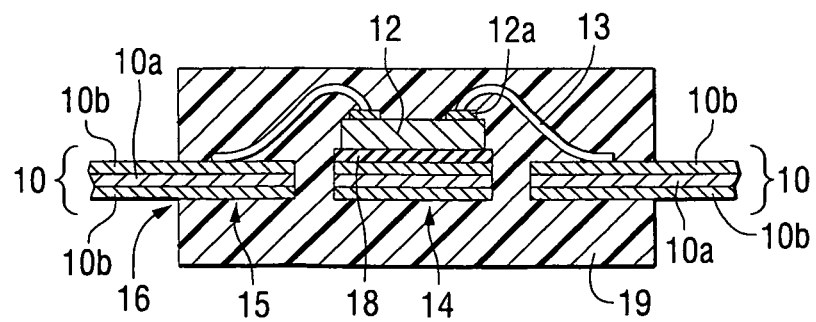
FIG. 5 is a sectional view along lines 5-5 of FIG. 4 after the portions within the dotted lines are encapsulated with a plastic material.

With reference to FIG. 5, the die 12 is bonded on the top major surface of the die pad 14 by an adhesive agent 18 consisting of, for example, an epoxy resin. As illustrated in FIG. 5, the strip or core 10 is formed of a conductive metal, both sides of which may be optionally pre plated as described generally above. Connection wires 13 of gold or an alloy thereof are bonded to the terminals of electrodes 12a of the semiconductor chip 12 and connect the semiconductor chip to the free ends of the inner lead portions 15. The semiconductor chip 12, connection wires 13 die pad 14 and inner lead portions 15 are all sealed, as shown in FIG. 5, in a plastic material 19 by the known transfer molding process or resin casting process. The portions of the lead frame 11 which are sealed in the plastic material 19 are indicated within the dotted lines in FIG. 4. Upon completion of the sealing, the supporting portions 17a are removed by punching and also the outer lead portions 16 and other supporting portion 17b are cut off of the core 10, thereby providing an electrical package as shown in FIG. 1. The outer lead portions 16 are bent in a gull-wing configuration as shown in FIG. 1. Thereafter, the exposed parts of the outer lead portions 16 are plated with solder to facilitate subsequent attachment of the electrical package to a circuit board.

As mentioned above, the soldering operation stresses the adhesive bond between the lead frame and the encapsulating plastic often resulting in failure along the plastic/metal interfacial surface. This is particularly a problem along the interfacial surface between the bottom major surface of the die pad 14 and the encapsulating plastic 19, as this interface is particularly susceptible to degradation by moisture and heat. To improve the adhesive bond along the plastic/metal interface, the invention has found that by inserting a SAM 10b adhered to the top and bottom major surfaces of the die pad significantly increases the strength and hydrothermal stability of the adhesive bond at the metal/plastic interface. Alternatively, the SAM can be selectively applied to the bottom major surface of the die pad. As shown in FIG. 5, the SAM may also be adhered to the interface between the metal leads 15 and the plastic encapsulation 19. However, rather than applying the SAM selectively to various portions of the lead frame that are in contact with the encapsulating plastic, the SAM is typically applied to the entire lead frame. By being in monolayer configuration electrical contact between the connection wires 13 and the inner leads 15 is not adversely affected.

Figure 6:
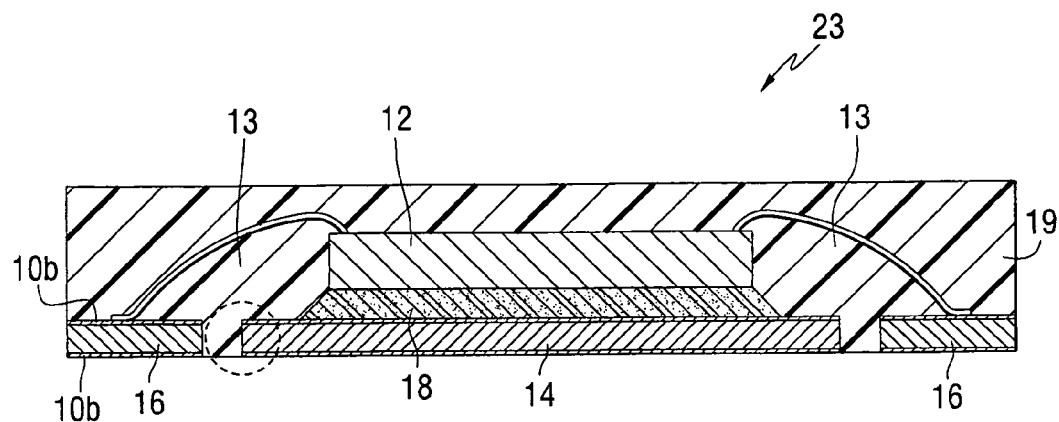
FIG. 6 is a cross-sectional view of a QFN semiconductor device.

Another form of the electrical package is shown in FIGS. 2 and 6. A circuit board 21 carries the electrical package 23. The circuit board may be a fiberglass-reinforced plastic such as an epoxy resin or a polyester resin having metal lines or circuits across the surface to which the electrical package makes electrical contact. As shown in FIG. 6, the die pad 14 and the leads 16 are not completely encapsulated by the plastic encapsulant 19 but are located on the bottom surface of the electrical package 23 where they are exposed and can be attached to the metal circuits of the circuit board through the leads 16. Attachment of the die 12 to the die pad 14 is through a conductive adhesive layer 18 such as a metal-filled resin, typically, a silver-filled epoxy resin, and wire bonding of the die to the leads 16 through metal wires 13 is as described above. The plastic encapsulant 19 is also as described above. Adhesive bond failure occurs principally in the circled area shown in FIG. 6. Insertion of the SAM 10b along the surfaces of the die pad improves the adhesive bond without interfering with the electrical conductivity as generally described above. The electrical packages shown in the drawings and described above show single dies. However, the electrical packages can have multiple dies such as multiple dies in stacked configurations.

A problem associated with metal-filled adhesives is adhesive resin bleed out. Adhesive resin components, such as low molecular weight epoxy components and/or crosslinking agents, separate from the bulk adhesive when it is applied between the die 12 and the die pad 14 during a bonding step. The separated resinous materials flow out from the edges of the adhesive and wets adjacent surfaces. If the resin bleed flows on to connection wires or solder pads, it may interfere with or even prevent the formation of wire bonds or solder joints, also possibly causing epoxy molding compound delamination, uneven package stress distribution, low moisture resistance, and ultimately poor package reliability, often resulting in circuit failure.

Adhesive resin bleed out can be minimized and eliminated by selection of an appropriate SAM as described below.

The lead frame typically has functional groups on its surface that are reactive with functional groups such as reactive functional groups associated with the SAM, for example, acid groups associated with SAMs such as organophosphorus SAMs such as derived from trivalent and pentavalent phosphorus compounds, particularly pentavalent phosphorus compounds such as organophosphorus acids such as p-phenol phosphonic acid. Typical functional groups on the lead frame that would react with phosphonic acids are metal oxygen species such as M=O, M-OH, M-O-M. Alternatively, the SAM could be comprised of trivalent phosphorous species such as (4-hydroxyphenyl)-diphenylphosphine that can form covalent bonds with zero valent metal species.

Many of the substrates such as copper and iron have oxide and/or hydroxyl groups on their surface. Other substrates such as gold or palladium typically have metal oxygen species on the surface, the concentration of which can be increased by exposure to a plasma or by exposure to ozone.

The SAM can be derived from an organophosphorus compound, organosilicon compound, organosulfur compound, organocarboxylates and organoborates. Organophosphorus compounds are preferred. The SAM can be derived from compounds comprising a single molecular species or several molecular species. The compound may be monomeric, oligomeric or polymeric.

Examples of suitable organophosphorus compounds are organophosphoric acids, organophosphonic acids and/or organophosphinic acids including derivatives thereof. Examples of derivatives are materials that perform similarly as acids such as acid salts, acid esters and acid complexes. The organo group of the organophosphorus acid may be monomeric or polymeric (that includes oligomeric).

Typical organophosphorus compounds are those of the structure:

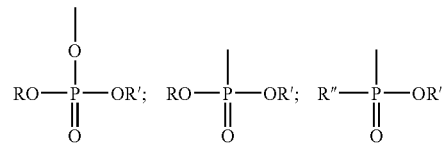

where R" is an organic radical such as a hydrocarbon or substituted hydrocarbon radical that may be monomeric having up to 200 carbon atoms or polymeric. R and R' are selected from H, a metal, an amine or an aliphatic or substituted aliphatic radical having 1 to 50 carbon atoms or an aromatic substituted aromatic radical having 6 to 50 carbon atoms or mixed aliphatic/aromatic radicals. Preferably R and R' are H.

Examples of phosphoric acids are compounds or a mixture of compounds having the following structure:

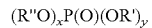

wherein x is 1-2, y is 1-2 and x+y=3, R" is an organic radical such as a hydrocarbon or substituted hydrocarbon radical that may be monomeric having up to 200 carbons or polymeric. Examples of monomeric radicals are those having a total of 1-50, such as 6-50 carbons. R' is H, a metal such as an alkali metal, for example, sodium or potassium or lower alkyl having 1 to 4 carbons, such as methyl or ethyl. Preferably, a portion of R' is H. R" can be aliphatic, substituted aliphatic, aromatic or mixed aliphatic/aromatic radicals. R" can be unsubstituted or substituted. R" can have terminal or omega groups such as fluoro such as perfluoro and functional groups such as ethylenically unsaturated groups, hydroxyl, carboxylic acid or amine groups that are reactive with the functional groups such as epoxy groups of the encapsulating plastic and epoxy groups of metal-filled epoxy resin adhesives.

Example of monomeric phosphonic acids are compounds or mixture of compounds having the formula:

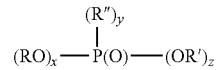

wherein x is 0-1, y is 1, z is 1-2 and x+y+z is 3. R" is organic radical such as a hydrocarbon or substituted hydrocarbon radical that may be monomeric having up to 200 carbon atoms or polymeric. Examples of monomeric radicals are those having a total of 1-50, such as 6-50 carbons. R' and R are H, a metal, such as an alkali metal, for example, sodium or potassium or lower alkyl having 1-4 carbons such as methyl or ethyl or a base such as an amine. Preferably at least a portion of R' and R is H. R can be aliphatic, aromatic or mixed aliphatic/aromatic. R" can be aliphatic, substituted aliphatic, aromatic, substituted aromatic or mixed aliphatic/aromatic radicals unsubstituted or substituted. R" can have terminal or omega groups such as fluoro such as perfluoro and functional groups such as ethylenically unsaturated groups, hydroxyl, carboxylic acid or amine groups that are reactive with the functional groups such as epoxy groups of the encapsulating plastic and epoxy groups of metal-filled epoxy resin adhesives.

Example of monomeric phosphinic acids are compounds or mixture of compounds having the formula:

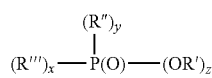

wherein x is 0-2, y is 0-2, z is 1 and x+y+z is 3. Preferably, R'" and R" are each independently organic radicals such as a hydrocarbon or substituted hydrocarbon radical that may be monomeric having up to 200 carbon atoms or polymeric. Examples of monomeric radicals are those having a total of 1-50, such as 6-50 carbons. R' is H, a metal, such as an alkali metal, for example, sodium or potassium or lower alkyl having 1-4 carbons, such as methyl or ethyl. Preferably a portion of R' is H. The organic component of the phosphinic acid (R, R") can be aliphatic, substituted aliphatic, aromatic, substituted aromatic or mixed aliphatic/aromatic. R'" and R" can be unsubstituted or substituted. R'" and R" can have terminal or omega groups such as fluoro such as perfluoro and functional groups such as ethylenically unsaturated groups, hydroxyl, carboxylic acid or amine groups that are reactive with the functional groups such as epoxy groups of the encapsulating plastic and epoxy groups of metal-filled epoxy resin adhesives.

Representative of the organophosphorous acids are as follows: amino trismethylene phosphonic acid, aminobenzylphosphonic acid, 3-amino propyl phosphonic acid, 0-aminophenyl phosphonic acid, 4-methoxyphenyl phosphonic acid, aminophenylphosphonic acid, aminophosphonobutyric acid, aminopropylphosphonic acid, benzhydrylphosphonic acid, benzylphosphonic acid, butylphosphonic acid, carboxyethylphosphonic acid, 16-carboxyhexadecylphosphonic acid, diphenylphosphinic acid, dodecylphosphonic acid, ethylidenediphosphonic acid, heptadecylphosphonic acid, methylbenzylphosphonic acid, naphthylmethylphosphonic acid, octadecylphosphonic acid, octylphosphonic acid, 4-mercaptobutylphosphonic acid, pentylphosphonic acid, phenylphosphinic acid, p-phenol phosphonic acid, cardanol phosphonic acid, phenylphosphonic acid, bis-(perfluoroheptyl) phosphinic acid, perfluorohexyl phosphonic acid, styrene phosphonic acid, dodecyl bis-1,12-phosphonic acid, poly(hexafluoropropylene oxide) phosphonic acid, poly(ethylene glycol) phosphonic acid, perfluorostyrenephosphonic acid, 11-acryloyloxyundecylphosphonic acid.

In addition to the monomeric organophosphorous acids, oligomeric or polymeric organophosphorous acids resulting from self-condensation of the respective monomeric acids may be used.

Preferably, at least a portion of the organo groups (R" and R'") in the structures above contain fluoride substituent and ethylenically unsaturated substituent such as acryloyloxy and methacryloyloxy, hereinafter designated as (meth)acryloyloxy. When both fluoride and ethylenically unsaturated substituents are present in organophosphorus acid component, adhesive resin bleed out is significantly minimized and may even be avoided. Preferably, at least 10 percent such as 20 to 80 percent of the organophosphorus component comprises fluoride substituent and ethylenically unsaturated substituent. The percentage being on a weight basis based on weight of fluoride and ethylenically unsaturated group ($CH_2=CH-$) divided by total weight of the organophosphorus acid component. The weight ratio of fluoride groups to ethylenically unsaturated groups in the organophosphorus component is typically from 1:99 to 80:20.

Preferably, the organo fluoro group is a perfluoro group such as a perfluoroalkyl group such as 1H, 1H', 2H' perfluorododecylphosphonic acid.

Preferably, the ethylenically unsaturated group is a (meth)acryloyl group such as a (meth)acrylate functional alkyl group such as 11-(meth)acryloyloxyundecyl. A specific organophosphorus compound is 11-acryloyloxyundecylphosphonic acid.

For application to the lead frame, the organophosphorus compound is dissolved in a liquid diluent, however it can also be applied via vacuum evaporation. The concentration is typically dilute, for example, no greater than 10 percent on a weight/volume basis, and preferably is within the range of 0.01 to 1.0 percent. The percentages are based on total weight or volume of the solution.

Examples of suitable diluents are water or hydrocarbons such as hexane isooctane and toluene; ketones such as methyl ethyl ketone; alcohols such as methanol, ethanol and isopropanol; and ethers such as tetrahydrofuran.

The solution of the organophosphorus compound can be applied to the surface of the lead frame by dipping, rolling, spraying, printing, stamping, or wiping. After application of the organophosphorus compound, the diluent is permitted to evaporate, with or without wiping during evaporation, preferably at ambient temperature, or optionally by the application of heat.

The resultant layer is typically thin, having a thickness of about 100 nanometers or less, such as 0.5 to 100 nanometers.

It is believed that the organophosphorus compound forms a SAM on the surface of the substrate. The self-assembled layer is formed by the adsorption and spontaneous organization of the organophosphorus compound on the surface of the lead frame. The organophosphorus compounds are amphiphilic molecules that have two functional groups. The first functional group, i.e., the head functional group, is an acid group that covalently bonds to the lead frame through reaction of the oxide and/or hydroxyl groups. The second functional group, i.e., the tail, the organo groups extend outwardly from the surface of the substrate. It is believed that in this configuration the monolayer, although very thin, is very effective in promoting adhesion of the metal/plastic interface. The thin monolayer configuration also does not affect the electrical conductivity associated with the wire bonding or attachment of the semiconductor device to the circuit board.

As mentioned above, the organophosphorus compound can be applied directly to the lead frame or can be applied indirectly to the substrate through an intermediate organometallic coating. When better adhesion and durability is desired, an organometallic coating may be applied to the lead frame, followed by application of the organophosphorus compound.

The organometallic compound is preferably derived from a metal or metalloid, preferably a transition metal, selected from Group III and Groups IIIB, IVB, VB and VIB of the Periodic Table. Transition metals are preferred, such as those selected from Groups IIIB, IVB, VB and VIB of the Periodic Table. Examples are tantalum, titanium, zirconium, lanthanum, hafnium and tungsten. The organo portion of the organometallic compound is selected from those groups that are reactive with functional groups, such as acid groups (or their derivatives) of the organophosphorus compound. Also, as will be described later, the organo group of the organometallic compound is believed to be reactive with groups on the substrate surfaces being treated such as oxide and hydroxyl groups. Examples of suitable organo groups of the organometallic compound are alkoxide groups containing from 1 to 18, preferably 2 to 4 carbon atoms, such as ethoxide, propoxide, isopropoxide, butoxide, isobutoxide, tert-butoxide and ethylhexyloxide. Mixed groups such as alkoxide, acetyl acetonate and chloride groups can be used.

The organometallic compounds can be in the form of simple alkoxylates or polymeric forms of the alkoxylate, and various chelates and complexes. For example, in the case of titanium and zirconium, the organometallic compound can include:

a. alkoxylates of titanium and zirconium having the general formula $M(OR)_4$, wherein M is selected from Ti and Zr and R is $C_{1-18}$ alkyl, b. polymeric alkyl titanates and zirconates obtainable by condensation of the alkoxylates of (a), i.e., partially hydrolyzed alkoxylates of the general formula $RO[M(OR)_2 O-]_{x-1}R$, wherein M and R are as above and x is a positive integer, c. titanium chelates, derived from ortho titanic acid and polyfunctional alcohols containing one or more additional hydroxyl, halo, keto, carboxyl or amino groups capable of donating electrons to titanium. Examples of these chelates are those having the general formula

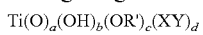

wherein a=4-b-c-d; b=4-a-c-d; c=4-a-b-d; d=4-a-b-c; R' is H, R as above or X—Y, wherein X is an electron donating group such as oxygen or nitrogen and Y is an aliphatic radical having a two or three carbon atom chain such as i. —$CH_2CH_2$—, e.g., of ethanolamine, diethanolamine and triethanolamine,

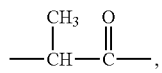

ii. e.g., of lactic acid,

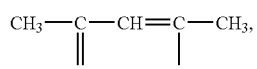

iii. e.g., of acetylacetone enol form, and

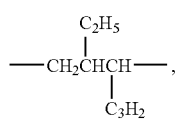

iv. e.g., as in 1,3-octyleneglycol, d. titanium acylates having the general formula $Ti(OCOR)_{4-n}(OR)_n$ wherein R is $C_{1-18}$ alkyl as above and n is an integer of from 1 to 3, and polymeric forms thereof, e. mixtures thereof.

The organometallic compound is usually dissolved or dispersed in a diluent. Examples of suitable diluents are alcohols such as methanol, ethanol and propanol, aliphatic hydrocarbons, such as hexane, isooctane and decane, ethers, for example, tetrahydrofuran and dialkyl ethers such as diethyl ether. Alternatively, the organometallic compound can be applied by vapor deposition techniques.

Also, adjuvant materials may be present with the organometallic compound and the diluent (organometallic compositions). Examples include stabilizers such as sterically hindered alcohols, surfactants and anti-static agents. The adjuvants if present are present in amounts of up to 30 percent by weight based on the non-volatile content of the composition.

The concentration of the organometallic compound in the composition is not particularly critical but is usually at least 0.01 millimolar, typically from 0.01 to 100 millimolar, and more typically from 0.1 to 50 millimolar.

The organometallic treating composition can be obtained by mixing all of the components at the same time or by combining the ingredients in several steps. Since in some cases, the organometallic compound is reactive with moisture, care should be taken that moisture is not introduced with the diluent or adjuvant materials and that mixing is conducted in a substantially anhydrous atmosphere.

The organometallic composition can be applied to the substrate surface by conventional means such as immersion coating such as dipping, rolling, spraying or wiping to form a film. The diluent is permitted to evaporate. This can be accomplished by heating to 50-200° C. or by simple exposure to ambient temperature, that is, from 20-25° C. It is believed that the resulting film is in the form of a polymeric metal oxide in multilayer form with unreacted alkoxide and hydroxyl groups. This is accomplished by depositing the film under conditions resulting in hydrolysis and self-condensation of the alkoxide. These reactions result in a polymeric coating being formed that provides cohesive strength to the film. The conditions necessary for these reactions to occur is to deposit the film in the presence of water, such as a moisture-containing atmosphere, however, these reactions can be performed in solution by the careful addition of water. The resulting film has some unreacted alkoxide groups and/or hydroxyl groups for subsequent reaction and covalent bonding with the organophosphorus over layer material. However, for readily co-reactive groups, ambient temperatures, that is, 20° C., may be sufficient. Although not intending to be bound by any theory, it is believed the polymeric metal oxide is of the structure:

where M is the metal of the invention, R is an alkyl group containing from 1 to 30 carbon atoms; x+y+z=V, the valence of M; x is at least 1, y is at least 1, z is at least 1; x=V−y−z; y=V−x−z; z=V−x−y; n is greater than 2, such as 2 to 1000. Optionally, the organometallic film may also contain chloride ligands.

The resulting film typically has a thickness of 0.5 to 100 nanometers. For other applications, thicker films can be used. When the organometallic compound is used neat and applied by chemical vapor deposition techniques in the absence of moisture, a thin metal alkoxide film is believed to form. Polymerization, if any occurs, is minimized and the film may be in monolayer configuration. When the organometallic compound is subjected to hydrolysis and self-condensation conditions as mentioned above, thicker films are formed.

Although not intending to be bound by any theory, it is believed the functional groups such as the acid or acid derivative groups of the organophosphorus compound covalently bond with the hydroxyl or alkoxide group of the organometallic coating, resulting in a durable film. It is believed that the organophosphorus compounds form a self-assembled layer that may be at least in part a monolayer on the surface of the substrate as generally described above.

Prior to application of the organophosphorus compound and/or the organometallic compound, the substrate is cleaned such as by a degreasing step particularly if the substrates have been in an environment where they have accumulated hydrocarbon films. A dip with an alcoholic solvent such as isopropyl alcohol may be used.

Also after application of the organophosphorus compound and/or the organometallic compound, the substrate may be given a post rinse to remove excess material. A post rinse with an organic solvent such as isopropyl alcohol may be used.

With pre plated lead frames such as those described above having a gold or platinum surface layer, the formation of a SAM with organophosphorus compounds was surprising. Formerly it was believed that to form monolayers on gold surfaces, thio compounds had to be used. It was believed that gold and palladium substrates had insufficient oxide and/or hydroxyl groups on their surface for monolayer self-assembly of an organophosphorus acid. However, it has been found that the SAMs derived from organophosphorus acids such as those described above do form on gold and palladium substrates. Either these substrates contain sufficient native oxide and/or hydroxyl groups or SAM formation is occurring by a different mechanism. Optionally gold or palladium substrates can be subjected to oxidizing conditions by treatment with an oxygen-containing plasma or by exposure to ozone prior to treatment with the SAM composition.

Whereas particular embodiments of this invention have been described above for purposes of illustration, it will be evident to those skilled in the art that numerous variations of the details of the present invention may be made without departing from the invention as defined in the appended claims.

What is claimed is:

1. A lead frame for an electronic package comprising:
   a surface; and
   a self-assembled monolayer derived from an organophosphorus acid selected from the group consisting of a phosphoric acid, a phosphonic acid and a phosphinic acid, having organo groups and acid groups adhered directly or indirectly to at least a portion of the surface with the acid groups adsorbed on the surface and the organo groups directed away from the surface.

2. The lead frame of claim 1 in which the self-assembled monolayer is adhered to the entire surface.

3. The lead frame of claim 1 in which the self-assembled monolayer is derived from compounds comprised of several molecular species.

4. The lead frame of claim 1 in which the organophosphorus acid has groups of the structure:

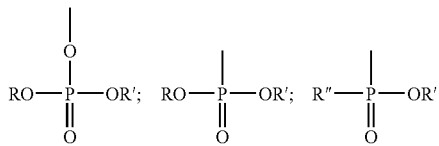

where R" is a hydrocarbon or substituted hydrocarbon radical having up to 200 carbon atoms and R and R' are selected from H, a metal, an amine or an aliphatic or substituted aliphatic radical having 1 to 50 carbon atoms or an aryl or substituted aryl radical having 6 to 50 carbon atoms.

5. The lead frame of claim 1 in which the organophosphorus acid has groups of the structure:

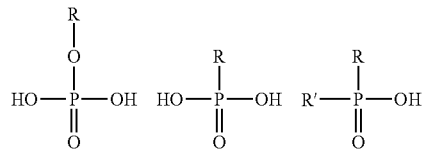

where R and R' are independently organic radicals that are aliphatic, aromatic or mixed aliphatic/aromatic; R and R' are an unsubstituted or a substituted hydrocarbon having from 1 to 30 carbon atoms.

6. The lead frame of claim 5 where R and R' contain a substituent selected from fluoro and an ethylenically unsaturated group.

7. The lead frame of claim 6 where the fluoro group is associated with a perfluoro group and the ethylenically unsaturated group is associated with a (meth)acrylate group.

8. The lead frame of claim 7 in which the perfluoro group is a perfluoroalkyl group and the (meth)acrylate group is a (meth)acryloyloxy group.

9. The lead frame of claim 8 in which the organophosphorus acid is a mixture of 1H,1H',2H,2H' perfluorododecylphosphonic acid and (meth)acryloyloxyundecylphosphonic acid.

10. The lead frame of claim 5 in which the organophosphorus acid is a mixture of organophosphorus compounds comprising at least 10 percent by weight fluoride substituent and ethylenically unsaturated substituent.

11. The lead frame of claim 10 in which the weight ratio of fluoride substituents to ethylenically unsaturated substituents is from 1:99 to 80:20.

12. The lead frame of claim 1 in which the self-assembled monolayer is indirectly adhered to the surface through an intermediate organometallic layer.

13. The lead frame of claim 12 in which the organometallic layer is derived from a metal alkoxide.

14. The lead frame of claim 12 in which the organometallic layer is derived from a polymeric metal oxide having unreacted alkoxide and hydroxyl groups.

15. The lead frame of claim 14 in which the polymeric metal oxide contains chloride ligands.

* * * * *